(12) United States Patent
Sharma et al.

(10) Patent No.: US 7,602,050 B2
(45) Date of Patent: Oct. 13, 2009

(54) INTEGRATED CIRCUIT PACKAGING

(75) Inventors: Laxminarayan Sharma, San Diego, CA (US); Mario Francisco Velez, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 439 days.

(21) Appl. No.: 11/399,017

(22) Filed: Apr. 5, 2006

(65) Prior Publication Data
US 2007/0096268 A1  May 3, 2007

Related U.S. Application Data

(60) Provisional application No. 60/700,143, filed on Jul. 18, 2005.

(51) Int. Cl.
*H01L 23/48* (2006.01)
(52) U.S. Cl. .................... 257/666; 257/676
(58) Field of Classification Search .......... 257/666, 257/676
See application file for complete search history.

(56) References Cited

U.S. PATENT DOCUMENTS 6,025,640 A * 2/2000 Yagi et al. ............ 257/666
6,111,311 A   8/2000 Suzuki

FOREIGN PATENT DOCUMENTS

EP   0272188 A2   6/1988
TW   426926       3/2001
TW   485586       5/2002
TW   517374       1/2003

OTHER PUBLICATIONS

International Search Report-PCT/US06/027462, International Search Authority-European Patent Office-Dec. 19, 2006.
Written Opinion-PCT/US06/027462, International Search Authority-European Patent Office-Dec. 19, 2006.

\* cited by examiner

*Primary Examiner*—Roy K Potter
(74) *Attorney, Agent, or Firm*—Nicholas J. Pauley; Peter M. Kamarchik; Sam Talpalatsky

(57) ABSTRACT

The disclosure provides integrated circuit packages including a lead frame having multiple I/O pads positioned proximate to the lead frame perimeter around a central ground paddle, an integrated circuit die having electrically conductive die terminals positioned on the central ground paddle, and multiple ground circuit pads positioned on and in electrical connection with the central ground paddle. Electrically conductive I/O circuit pads are arranged about the die between the ground circuit pads and the I/O pads, each I/O circuit pad electrically connected to one of the I/O pads. Electrically conductive bond wires connect one or more of the die terminals to one or more I/O circuit pads or one or more ground circuit pads. In certain embodiments, the disclosure further provides an integrated circuit positioned to engage the integrated circuit die in electrical connection with the die terminals. The disclosure also relates to methods of packaging an integrated circuit to reduce packaging parasitics.

29 Claims, 5 Drawing Sheets

INTEGRATED CIRCUIT PACKAGING

This application claims priority under 35 U.S.C. 119(e) to Provisional U.S. Patent Application No. 60/700,143 filed Jul. 18, 2005, the entire contents of which is incorporated herein by reference.

TECHNICAL FIELD

The disclosure relates to integrated circuit packaging and, more particularly, methods of reducing packaging parasitics for die-mounted integrated circuits.

BACKGROUND

In an integrated circuit package, a die having multiple electrically conductive die terminals is typically mounted on a surface of a lead frame. The lead frame includes a central ground paddle surrounded by input/output ("I/O") circuit pads positioned on the surface of the lead frame near the outer perimeter of the lead frame. The die terminals may be electrically connected to the I/O circuit pads on the surface of the lead frame using electrically conductive bond wires. Some of the die terminals may be electrically connected to I/O circuit pads and/or ground circuit paddles using downbonds, thereby providing electrical or logical signal routing and connectivity between the die terminals on a top surface of the lead frame, and ground attachment paddles and/or I/O circuit pads on a bottom surface of the lead frame.

As die and package sizes of integrated circuits have been reduced, there have been recent efforts to mount several dies on a single lead frame. In addition, as the functions of integrated circuits have become increasingly complex, the number of die terminals on the lead frame has increased dramatically, leading to a dramatic increase in the number of ground circuit pads and I/O circuit pads required to provide an electrical connection from the bottom surface to the top surface of the lead frame. In addition, the number of bond wires and downbonds has also increased, creating longer wire runs to connect the die terminals to a common ground attachment paddle. Electrical noise, such as noise caused by parasitic inductance or capacitance, often arises when the bond wire runs become too long.

SUMMARY

In general, this disclosure is directed to integrated circuit packages and methods of packaging integrated circuits to reduce packaging parasitics. More specifically, the disclosure is directed to techniques for reducing integrated circuit packaging parasitics by decreasing the length of bond wires extending across or through the surface of an integrated circuit packaging lead frame, or by decreasing the number of downbonds.

In one embodiment, the disclosure provides an integrated circuit package including a lead frame having multiple I/O pads positioned proximate to the perimeter of the lead frame around a central ground paddle. An integrated circuit die having electrically conductive die terminals is positioned on the central ground paddle, and electrically conductive I/O circuit pads are arranged about the die between the I/O pads and the die, each I/O circuit pad electrically connected to one of the I/O pads. Electrically conductive ground circuit pads, electrically connected to the central ground paddle, are also positioned around the die on the central ground paddle between the die and the I/O circuit pads. Electrically conductive bond wires connect one or more of the die terminals to one or more I/O circuit pads or one or more ground circuit pads.

In certain exemplary embodiments, the disclosure further provides an integrated circuit positioned to engage the integrated circuit die in electrical connection with the die terminals. In some embodiments, one or more bond wires may also connect between an I/O circuit pad and a ground circuit pad.

In another embodiment, the disclosure provides an integrated circuit including a logic circuit having a plurality of logic gates positioned to communicably engage die terminals of an integrated circuit die. The die has a plurality of electrically conductive die terminals and is positioned on the central ground paddle of a lead frame. The lead frame includes I/O pads positioned proximate to the perimeter of the lead frame around the central ground paddle. Electrically conductive I/O circuit pads are also arranged about the die between the die and the I/O pads, each I/O circuit pad electrically connected to one of the I/O pads. Electrically conductive ground circuit pads, electrically connected to the central ground paddle, are also positioned around the die between the die and the I/O circuit pads. Electrically conductive bond wires connect one or more of the die terminals to one or more I/O circuit pads or one or more ground circuit pads. In some embodiments, one or more bond wires may also connect between an I/O circuit pad and a ground circuit pad.

In a further embodiment, the disclosure provides a method for packaging an integrated circuit. The method includes mounting an integrated circuit die including multiple electrically conductive die terminals to a central ground paddle on a lead frame. The lead frame includes electrically conductive I/O pads positioned around the central ground paddle proximate to the outer perimeter of the lead frame. The method further includes forming electrically conductive I/O circuit pads about the die between the I/O pads and the die, each I/O circuit pad electrically connected to one of the I/O pads. The method also includes forming electrically conductive ground circuit pads in electrical connection with the central ground paddle around the die between the die and the I/O circuit pads, and further includes electrically connecting an electrically conductive bond wire between each of the die terminals and one or more of the I/O circuit pads or the ground circuit pads.

The details of one or more embodiments are set forth in the accompanying drawings and the description below. Other features, objects, and advantages will be apparent from the description and drawings, and from the claims.

DETAILED DESCRIPTION

Figure 1:
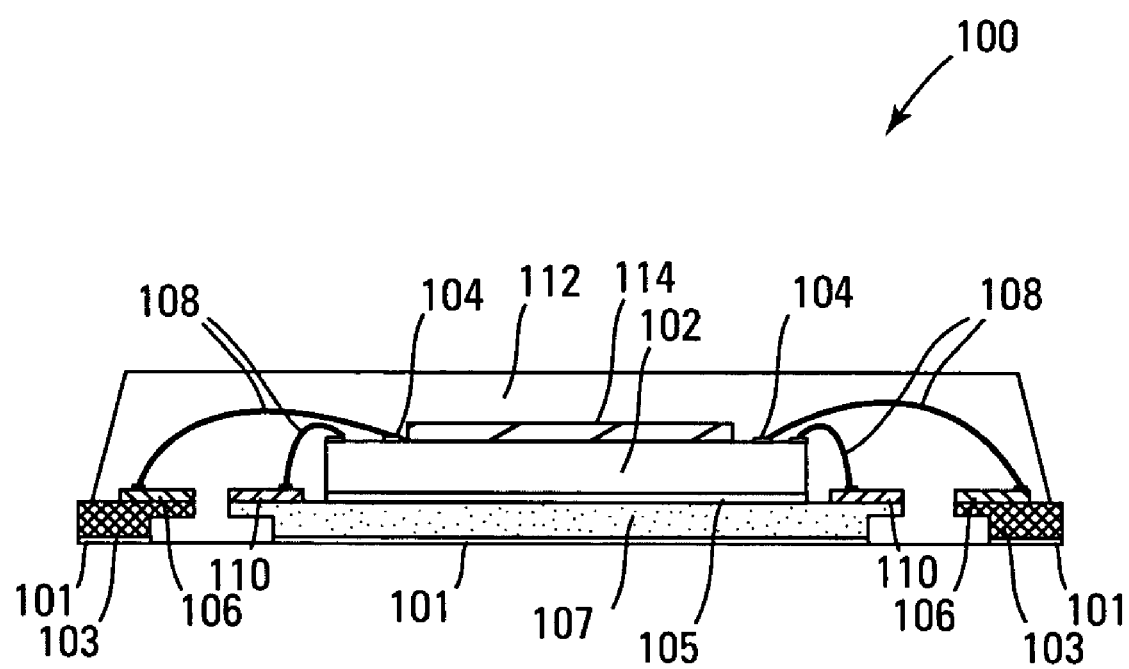
FIG. 1 is a schematic side view diagram illustrating an integrated circuit and integrated circuit package according to an embodiment of the disclosure.

FIG. 1 is a schematic side view diagram illustrating an integrated circuit package 100 including a lead frame 101 having a plurality of I/O pads 103 positioned around a central ground paddle 107 proximate to the outer perimeter of the lead frame 101. An integrated circuit die 102 including a plurality of electrically conductive die terminals 104 is mounted to the central ground paddle 107 with a bonding layer 105, and electrically conductive I/O circuit pads 106 are arranged about the die 102, each circuit pad 106 being positioned on and electrically connected to one of the I/O pads 103. Electrically conductive ground circuit pads 110, electrically connected to the central ground paddle 107, are positioned around the die 102 between the die 102 and the I/O circuit pads 106. Electrically conductive bond wires 108 connect one or more of the die terminals 104 to one or more I/O circuit pads 106, or one or more ground circuit pads 110.

In some embodiments (not illustrated in FIG. 1), one or more bond wires 108 may connect between an I/O circuit pad 106 and a ground circuit pad 110. A multi-pin integrated circuit 114 may be mounted on the die 102 in communicable engagement with the die terminals 104. A mold compound 112 may overlay the lead frame 101, encapsulating and insulating one or more of the die 102, the bond wires 108, the ground circuit pads 110 and the I/O circuit pads 106. The mold compound may optionally overlay the multi-pin integrated circuit 114 as shown in FIG. 1, encapsulating and insulating the integrated circuit.

Figure 2:
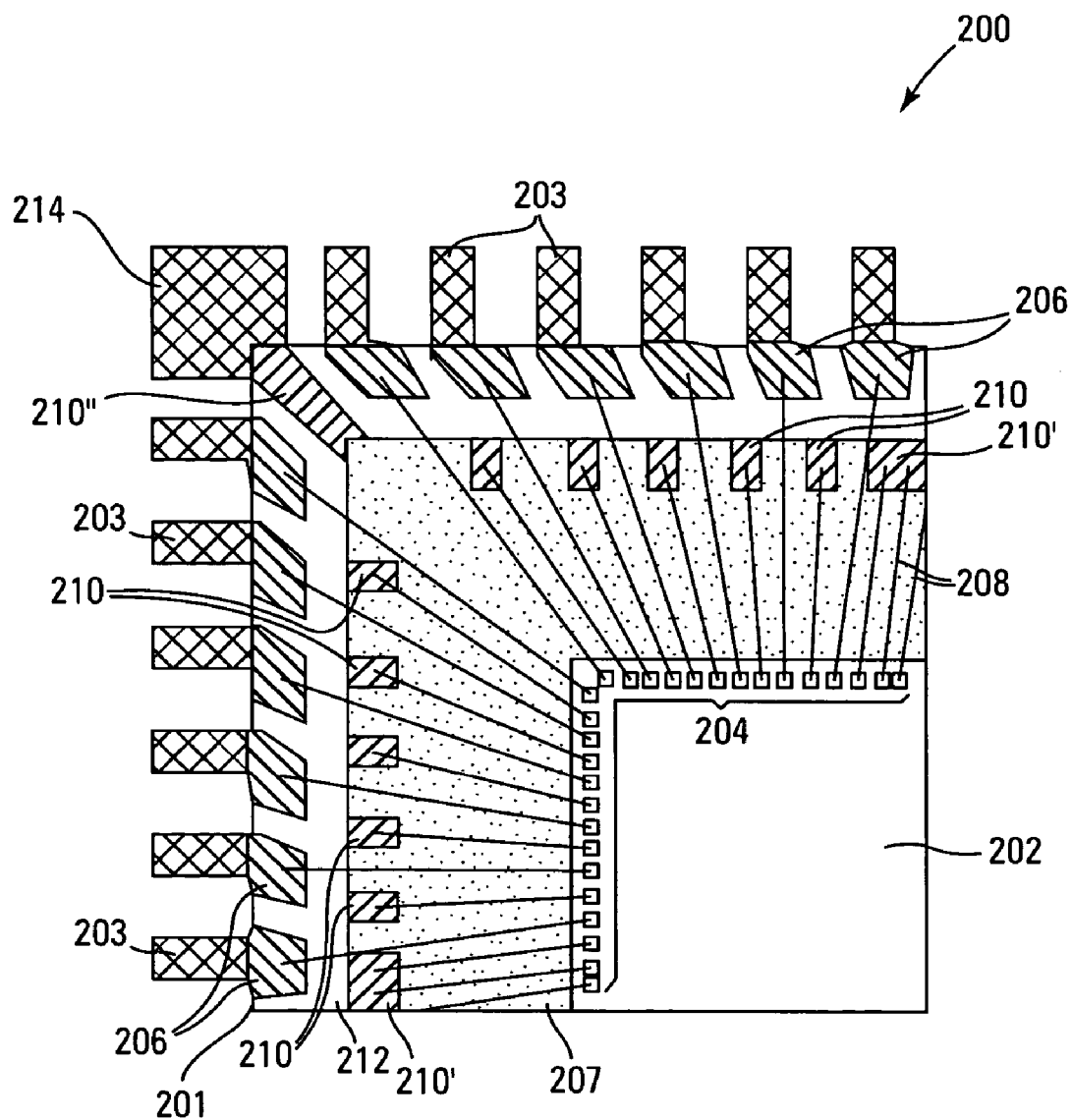
FIG. 2 is a schematic diagram illustrating an integrated circuit package and packaging method according to a further embodiment of the disclosure.

FIG. 2 is a schematic top partial view diagram of an integrated circuit package 200 including a lead frame 201 having a plurality of I/O pads 203 positioned around a central ground paddle 207 proximate to the outer perimeter of the lead frame 201. An integrated circuit die 202, including a plurality of electrically conductive die terminals 204, is mounted to the central ground paddle 207, and electrically conductive I/O circuit pads 206 are arranged about the die 202, each circuit pad 206 being positioned on and electrically connected to one of the I/O pads 203. Electrically conductive ground circuit pads 210, electrically connected to the central ground paddle 207, are positioned around the die 202 between the die 202 and the I/O circuit pads 206. Electrically conductive bond wires 208 connect one or more of the die terminals 204 to one or more I/O circuit pads 206, or one or more ground circuit pads 210.

In some embodiments, a multi-pin integrated circuit (not shown in FIG. 2) may be mounted on the die 202 in communicable engagement with the die terminals 204. In certain embodiments, at least two bond wires 208 electrically connect to a single ground circuit pad 210'. In certain other embodiments, a corner ground pad 214 is positioned proximate to a corner of the lead frame 201 and connected to the central ground paddle 207 by a corner ground circuit pad 210". In other exemplary embodiments, the integrated circuit package 200 may be constructed to reduce the length of the bond wires 208 between the die terminals 204 of the integrated circuit die 202, and the ground circuit pads 210 positioned on and electrically connected to the central ground paddle 207 of the lead frame 201, thereby reducing the parasitic inductance associated with the bond wires 208 connected to the ground circuit pads 210.

In the particular embodiment illustrated in FIG. 2, the lead frame 201 and integrated circuit die 202 are both generally rectangular in shape, and the die terminals 204 are arrayed about the perimeter of the generally rectangular shaped integrated circuit die 202. In this particular embodiment, the I/O circuit pads 206 are arrayed about the generally rectangular perimeter of the lead frame 201 proximate to the edges of the lead frame. The particular embodiment of an integrated circuit package illustrated in FIG. 2 illustrates the arrangement of ground circuit pads 210 in a linear array around the integrated circuit die 202 between the die 202 and I/O circuit pads 206 along the edges of the generally rectangular perimeter of the central ground paddle 207. Although other arrangements of ground circuit pads 210 are within the scope of the present disclosure, the arrangement illustrated in FIG. 2 may be suitable for packaging a single, generally rectangular integrated circuit on a generally rectangular lead frame 201.

Figure 3:
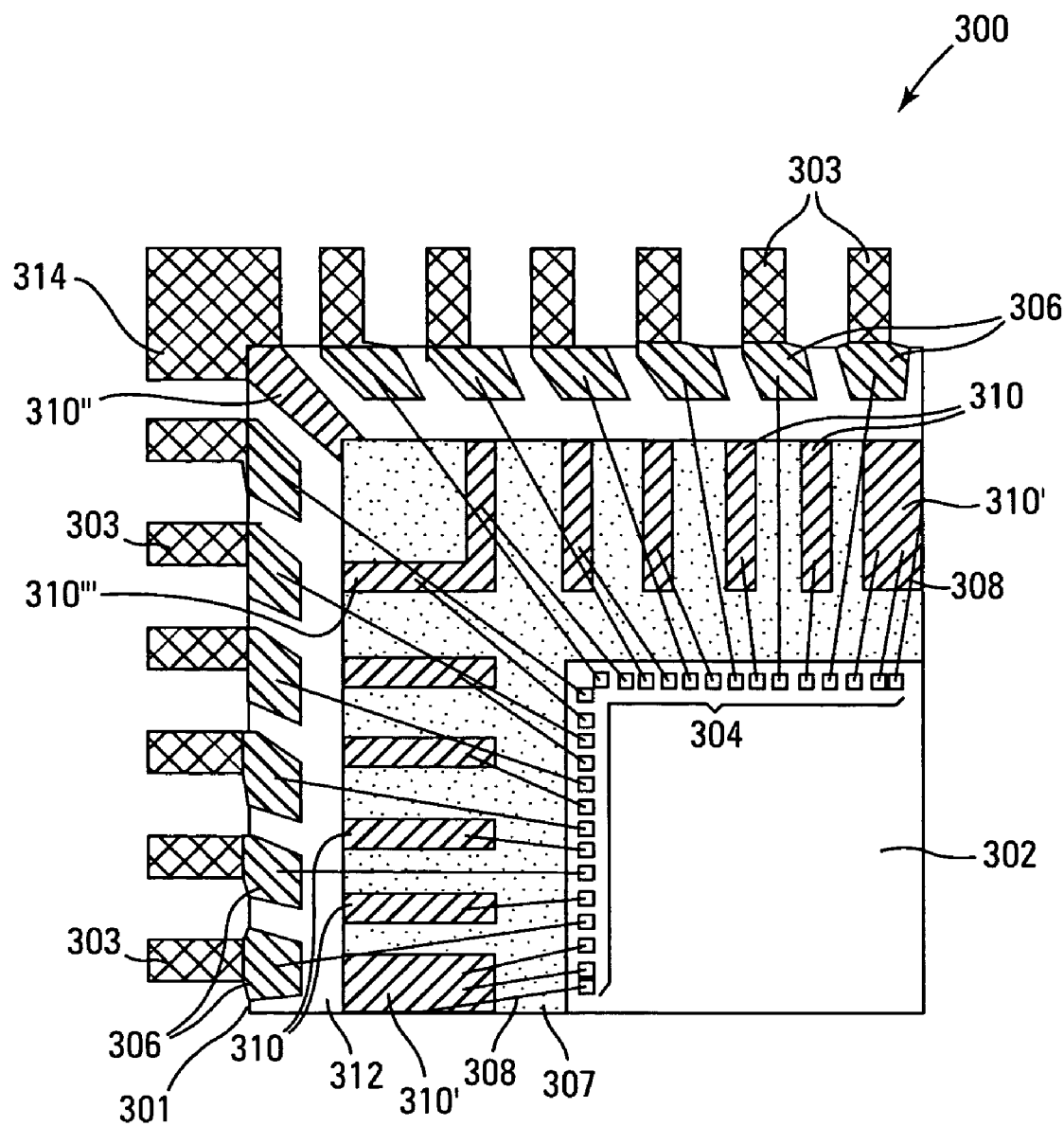
FIG. 3 is a schematic diagram illustrating an integrated circuit package and packaging method according to an additional embodiment of the disclosure.

FIG. 3 is a schematic top partial view diagram of an integrated circuit package 300 including a lead frame 301 having a plurality of I/O pads 303 positioned around a central ground paddle 307 proximate to the outer perimeter of the lead frame 301. Integrated circuit package 300 is similar to integrated circuit package 200 of FIG. 2. However, integrated circuit package 300 illustrates use of multiple ground circuit pads 310 having a generally rectangular shape including a long dimension and a short dimension, wherein each of the long dimensions is oriented substantially orthogonal to at least one edge defined by the generally rectangular perimeter of the central ground paddle 307. The embodiment of FIG. 3 is thus adapted for use with a smaller integrated circuit die 302 in a smaller integrated circuit package 300 relative to the integrated circuit package 200 of FIG. 2.

Like integrated circuit package 200 of FIG. 2, integrated circuit package 300 has a lead frame 301 having a plurality of I/O pads 303 positioned around a central ground paddle 307 proximate to the outer perimeter of the lead frame 301. An integrated circuit die 302, including a plurality of electrically conductive die terminals 304, is mounted to the central ground paddle 307, and electrically conductive I/O circuit pads 306 are arranged about the die 302, each circuit pad 306 being positioned on and electrically connected to one of the I/O pads 303. Electrically conductive ground circuit pads 310, electrically connected to the central ground paddle 307, are positioned around the die 302 between the die 302 and the I/O circuit pads 306. Electrically conductive bond wires 308 connect one or more of the die terminals 304 to one or more I/O circuit pads 306, or one or more ground circuit pads 310.

In some embodiments, a multi-pin integrated circuit (not shown in FIG. 3) may be mounted on the die 302 in communicable engagement with the die terminals 304. In certain embodiments, at least two bond wires 308 electrically connect to a single ground circuit pad 310'. In certain other embodiments, a corner ground pad 314 is positioned proximate to a corner of the lead frame 301 and connected to the central ground paddle 307 by a corner ground circuit pad 310". In additional exemplary embodiments, a corner ground circuit pad 310'" may be positioned proximate to a corner of the generally rectangular central ground paddle 307. In some exemplary embodiments, the integrated circuit package 300 may be constructed to reduce the length of the bond wires 308 between the die terminals 304 of the integrated circuit die 302, and the ground circuit pads 310 positioned on the central ground paddle 307 of the lead frame 301, thereby reducing the parasitic inductance associated with the ground bond wires 308.

In the particular embodiment illustrated in FIG. 3, the lead frame 301 and integrated circuit die 302 are both generally rectangular in shape, and the die terminals 304 are arrayed about the perimeter of the generally rectangular shaped integrated circuit die 302. In this particular embodiment, the I/O circuit pads 306 are arrayed about the generally rectangular perimeter of the lead frame 301 proximate to the edges of the lead frame 301. The particular embodiment of an integrated circuit package 300 illustrated in FIG. 3 illustrates the arrangement of the ground circuit pads 310 in a linear array around the integrated circuit die 302 between the die 302 and the plurality of I/O circuit pads 306 along at least one edge defined by the perimeter of the central ground paddle 307. Although other arrangements of the plurality of ground circuit pads 310 can be provided, the arrangement illustrated in FIG. 3 may be suitable for packaging a single, generally rectangular integrated circuit using a generally rectangular integrated circuit die 302 having a large number of die terminals 304, and positioned on the central ground paddle 307 of a generally rectangular lead frame 301.

The structure shown in FIG. 3 may be especially useful for packaging of high density integrated circuits. In particular, the structure shown in FIG. 3 may be useful for packaging high density integrated circuits having five or more, more preferably seven or more, most preferably ten or more die terminals 304 per linear centimeter of perimeter of the integrated circuit die 302. In this particular embodiment, each of the ground circuit pads 310 has a generally rectangular shape including a long dimension and a short dimension, and each of the long dimensions of the generally rectangular shaped ground circuit pads 310 is oriented substantially orthogonal to at least one edge of the lead frame 301.

Figure 4:
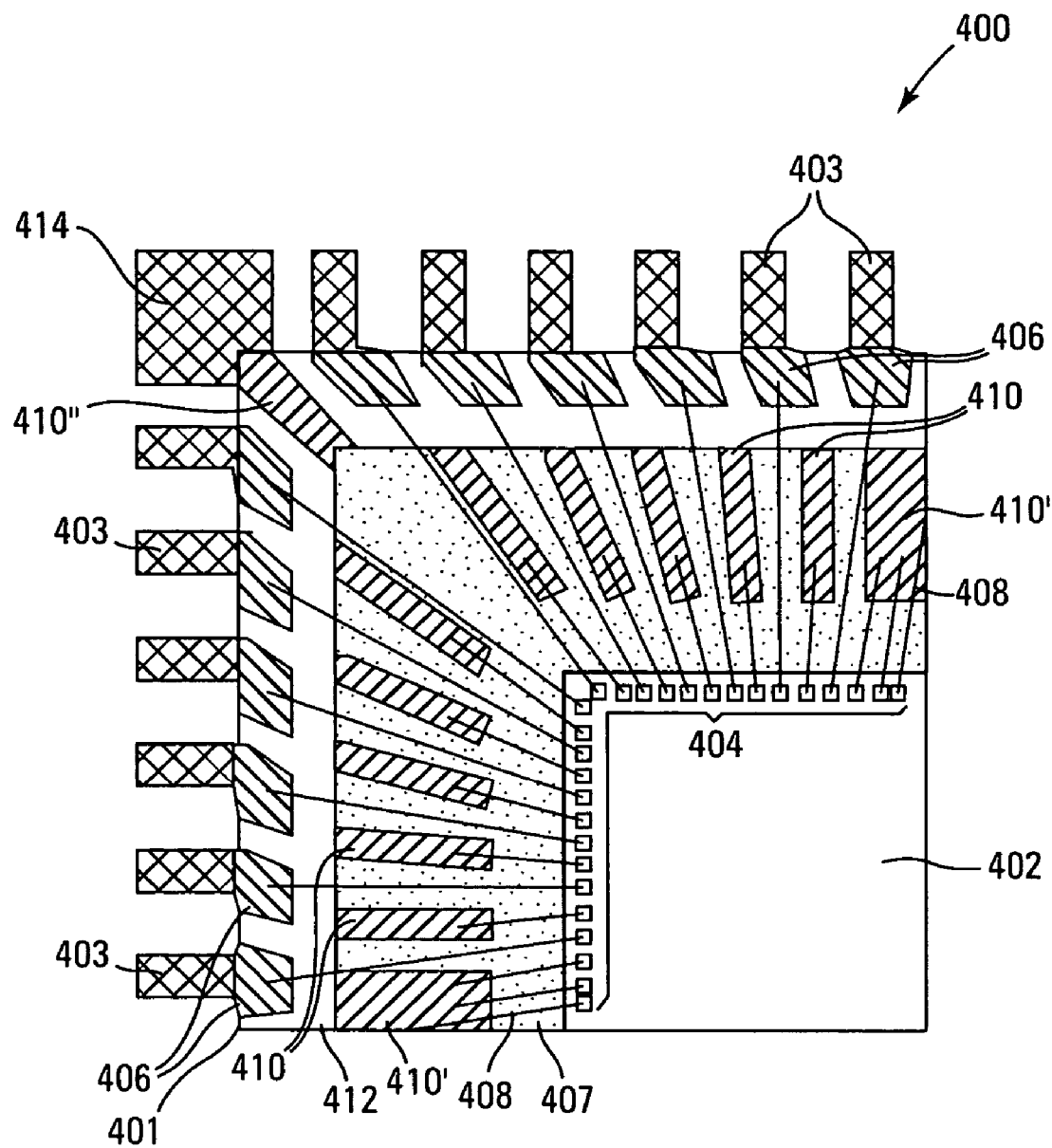
FIG. 4 is a schematic diagram illustrating an integrated circuit package and packaging method according to an alternative embodiment of the disclosure.

FIG. 4 is a schematic top partial view diagram of an integrated circuit package 400 including a lead frame 401 having a plurality of I/O pads 403 positioned around a central ground paddle 407 proximate to the outer perimeter of the lead frame. Integrated circuit package 400 is similar to integrated circuit package 200 of FIG. 2. However, integrated circuit package 400 illustrates use of multiple ground circuit pads 410 having a generally trapezoidal shape including a long dimension and a short dimension, wherein at least one of the long dimensions forms an angle of ninety degrees or less with at least one edge defined by the generally rectangular perimeter of the central ground paddle 407. The embodiment of FIG. 4 is thus adapted for use with an integrated circuit die 402 having a large number of closely spaced die terminals 404, and/or a large number of closely spaced bond wires covering a comparable area of the lead frame relative to the integrated circuit package 200 of FIG. 2.

Like integrated circuit package 200 of FIG. 2, integrated circuit package 400 has a lead frame 401 having a plurality of I/O pads 403 positioned around a central ground paddle 407 proximate to the outer perimeter of the lead frame 401. An integrated circuit die 402, including a plurality of electrically conductive die terminals 404, is mounted to the central ground paddle 407, and electrically conductive I/O circuit pads 406 are arranged about the die 402, each circuit pad 406 being positioned on and electrically connected to one of the I/O pads 403. Electrically conductive ground circuit pads 410, electrically connected to the central ground paddle 407, are positioned around the die 402 between the die 402 and the I/O circuit pads 406. Electrically conductive bond wires 408 connect one or more of the die terminals 404 to one or more I/O circuit pads 406, or one or more ground circuit pads 410.

In some embodiments, a multi-pin integrated circuit (not shown in FIG. 4) may be mounted on the die 402 in communicable engagement with the die terminals 404. In certain exemplary embodiments, at least two bond wires 408 electrically connect to a single ground circuit pad 410'. In certain other embodiments, a corner ground pad 414 is positioned proximate to a corner of the lead frame 401 and connected to the central ground paddle 407 by a corner ground circuit pad 410". In additional exemplary embodiments, the integrated circuit package 400 may be constructed to reduce the length of the bond wires 408 between the die terminals 404 of the integrated circuit die 402, and the ground circuit pads 410 positioned on the central ground paddle 407 of the lead frame 401, thereby reducing the parasitic inductance associated with the ground bond wires 408.

In the particular embodiment illustrated in FIG. 4, the lead frame 401 is generally rectangular in shape, and the die terminals 404 are arrayed about the perimeter of the generally rectangular shaped integrated circuit die 402. In this particular embodiment, the I/O circuit pads 406 are arrayed about the generally rectangular perimeter of the lead frame 401. The particular embodiment of an integrated circuit package illustrated in FIG. 4 illustrates the arrangement of the plurality of ground circuit pads 410 in a linear array around the integrated circuit die 402 between the die 402 and the I/O circuit pads 406 along one edge of the generally rectangular perimeter of central ground paddle 407. Although other arrangements of the ground circuit pads 410 are possible, the arrangement illustrated in FIG. 4 is an embodiment that may be suitable for packaging a single, generally rectangular integrated circuit using a generally rectangular integrated circuit die having a very large number of die terminals 404, and positioned on the central ground paddle 407 of a generally rectangular lead frame 401.

The structure shown in FIG. 4 may be especially useful for packaging of very high density integrated circuits. In particular, the structure shown in FIG. 4 may be useful for packaging very high density integrated circuits having ten or more, more preferably fifteen or more, most preferably twenty or more die terminals 404 per linear centimeter of perimeter of the integrated circuit die 402. In this particular embodiment, each of ground circuit pads 410 has a generally trapezoidal shape including a long dimension and a short dimension, and at least one long dimension of one or more of the generally trapezoidal shaped ground circuit pads 410 is oriented at an angle of ninety degrees or less relative to at least one of the edges defined by the generally rectangular perimeter of the central ground paddle 407. Ground circuit pads 410 may form a generally fan-like pattern about the integrated circuit die 402, as exemplified in FIG. 4. More particularly, each of the edges defining a generally rectangular perimeter of the central ground paddle 410' may join at least one other edge to form a corner, and each corner may be proximate to a generally trapezoidal shaped ground circuit pad oriented at an acute angle relative to the joined edges, as exemplified in FIG. 4.

FIG. 4 also illustrates an embodiment in which the shape of the ground circuit pads 410 is varied from generally trapezoidal at the corners of the generally rectangular perimeter of lead frame 401, to a generally rectangular shape as the position of the ground circuit pad 410 becomes closer to the integrated circuit die 402. Such an arrangement may substantially reduce the cumulative length of the ground bond wires 408 from running across the surface of the lead frame 401 from the die terminal 404 to the ground circuit pads 410, and thereby substantially reduce parasitic inductance for the integrated circuit package 400.

Figure 5:
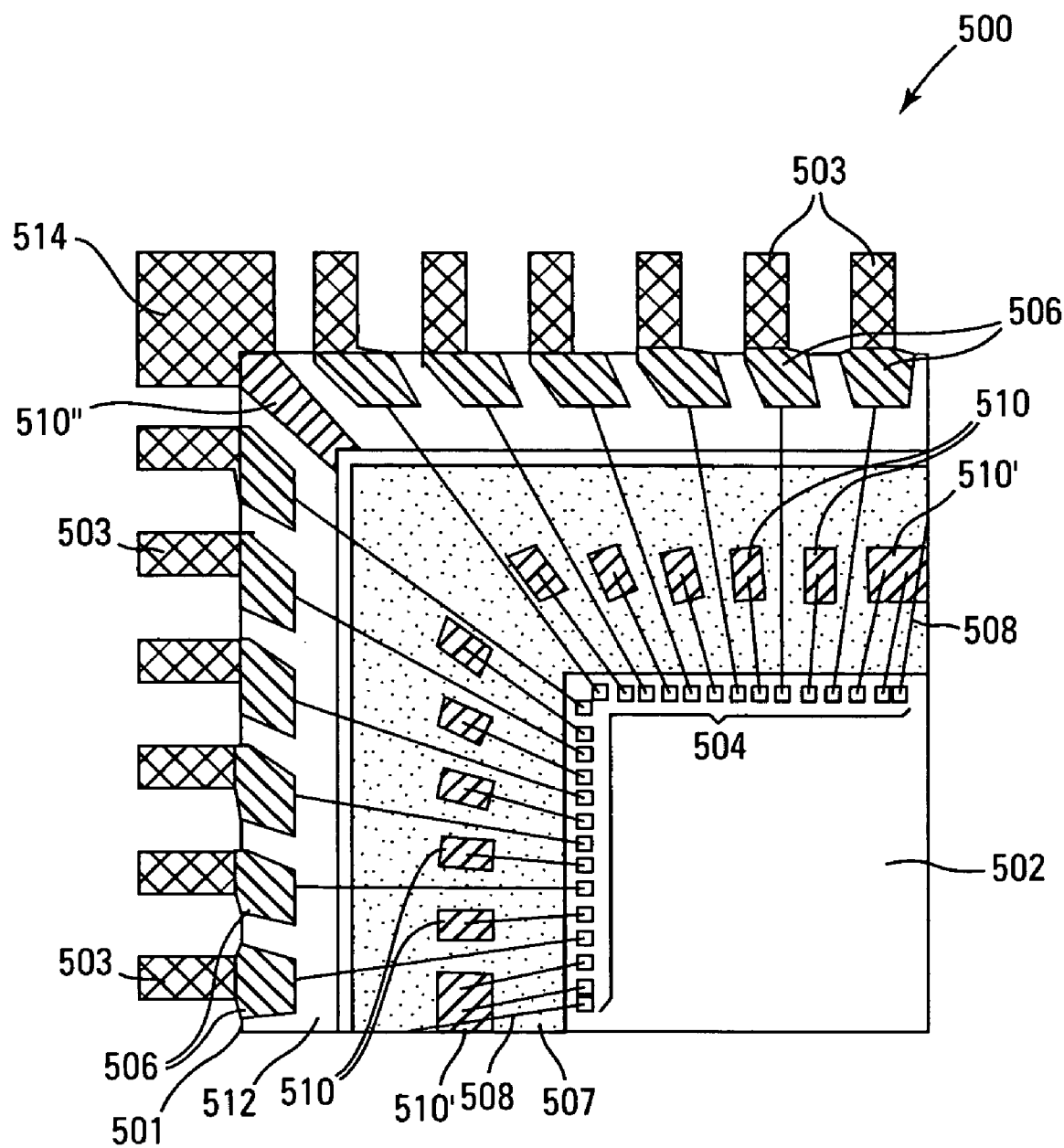
FIG. 5 is a schematic diagram illustrating an integrated circuit package and packaging method according to another embodiment of the disclosure.

FIG. 5 is a schematic top partial view diagram of an integrated circuit package 500 including a lead frame 501 having a plurality of I/O pads 503 positioned around a central ground paddle 507 proximate to the outer perimeter of the lead frame. Integrated circuit package 500 is similar to integrated circuit package 400 of FIG. 4. However, in addition to illustrating the use of multiple ground circuit pads 510 having a generally trapezoidal shape including a long dimension and a short dimension, wherein at least one of the long dimensions is oriented at an angle of ninety degrees or less relative to at least one edge defined by the generally rectangular perimeter of the central ground paddle 507, FIG. 5 also illustrates positioning of the ground circuit pads 510 closer to the die 502 in order to further reduce the lengths of the bond wires 508. The embodiment of FIG. 4 is thus adapted for use with very small integrated circuit packages 500 including an integrated circuit die 402 having an extremely large number of closely spaced die terminals 404, and/or a large number of closely spaced ground bond wires 508 running from the die terminals 504 to the ground circuit pads 510.

Like integrated circuit package 400 of FIG. 4, integrated circuit package 500 has a lead frame 501 having a plurality of I/O pads 503 positioned around a central ground paddle 507 proximate to the outer perimeter of the lead frame 501. An integrated circuit die 502, including a plurality of electrically conductive die terminals 504, is mounted to the central ground paddle 507, and a plurality of electrically conductive I/O circuit pads 506 is arranged about the die 502, each circuit pad 506 being positioned on and electrically connected to one of the I/O pads 503. Electrically conductive ground circuit pads 510, electrically connected to the central ground paddle 507, are positioned around the die 502 between the die 502 and the I/O circuit pads 506. Electrically conductive bond wires 508 connect one or more of the die terminals 504 to one or more I/O circuit pads 506, or one or more ground circuit pads 510.

In some embodiments, a multi-pin integrated circuit (not shown in FIG. 5) may be mounted on the die 502 in communicable engagement with the die terminals 504. In some exemplary embodiments, at least two bond wires 508 electrically connect to a single ground circuit pad 510'. In certain other embodiments, a corner ground pad 514 is positioned proximate to a corner of the lead frame 501 and connected to the central ground paddle 507 by a corner ground circuit pad 510". In additional exemplary embodiments, the integrated circuit package 500 may be constructed to reduce the length of the ground bond wires 508 between the die terminals 504 of the integrated circuit die 502, and the ground circuit pads 510 positioned on the central ground paddle 507 of the lead frame 501, thereby reducing the parasitic inductance associated with the ground bond wires 508.

In the particular embodiment illustrated in FIG. 5, the lead frame 501 is generally rectangular in shape, and the die terminals 504 are arrayed about the perimeter of the generally rectangular shaped integrated circuit die 502. In this particular embodiment, the I/O circuit pads 506 are arrayed about the generally rectangular perimeter of the lead frame 501. The particular embodiment of an integrated circuit package illustrated in FIG. 5 illustrates the arrangement of the ground circuit pads 510 in a linear array around the integrated circuit die 502 between the die 502 and the I/O circuit pads 506 along one edge of the generally rectangular perimeter of the central ground paddle 507. Although other arrangements of the ground circuit pads 510 are possible, the arrangement illustrated in FIG. 5 is an embodiment that may be suitable for packaging a single, generally rectangular integrated circuit using a generally rectangular integrated circuit die having a very large number of die terminals 504, and positioned on the central ground paddle 507 of a smaller, generally rectangular lead frame 501.

The structure shown in FIG. 5 may be especially useful for packaging of extremely high density integrated circuits in very small integrated circuit packages 500. In particular, the structure shown in FIG. 5 may be useful for packaging very high density integrated circuits having 20 or more, more preferably 25 or more, most preferably 30 or more die terminals 504 per linear centimeter of perimeter of the integrated circuit die 502. In this exemplary embodiment, each of ground circuit pads 510 has a generally trapezoidal shape including a long dimension and a short dimension, and at least one long dimension of one or more of the plurality of generally trapezoidal shaped ground circuit pads 510 is oriented at an angle of ninety degrees or less relative to at least one of the plurality of edges of the central ground paddle 507. Ground circuit pads 510 may form a generally fan-like pattern about the integrated circuit die 502, as exemplified in FIG. 5. More particularly, each of the generally trapezoidal shaped ground circuit pads may be positioned inward from an edge defined by the generally rectangular perimeter of the central ground paddle 507 proximate to the die 502, as exemplified in FIG. 5.

Although the lead frame and integrated circuit die in each of the embodiments illustrated in FIGS. 1-5 are shown with generally rectangular shape perimeters, it will be understood by one skilled in the art that the lead frame and/or die may have non-rectangular shapes, for example, square, trapezoidal or polygonal shapes, without deviating from the scope of the present disclosure. Furthermore, in each of the embodiments illustrated in FIGS. 2-5, the ground circuit pads (210, 310, 410 and 510) are shown with a generally rectangular or trapezoidal shape. However, it will be further understood by one skilled in the art that the ground circuit pads (210, 310, 410 and 510) may have virtually any shape without departing from the scope of this disclosure. For example, the ground circuit pads (210, 310,1 410 and 510) may have a shape selected from the group consisting of triangular, rectangular, trapezoidal, polygonal, hemispherical and circular shapes.

The integrated circuit packages (100, 200, 300, 400 and 500) of each of the embodiments illustrated in FIGS. 1-5 may also optionally include an integrated circuit (not shown in FIGS. 2-5) positioned within the respective integrated circuit die (102, 202, 302, 402 or 502) and electrically connected to the plurality of die terminals (104, 204, 304, 404 or 504). The integrated circuit may be virtually any electronic device package, such as a microprocessor, an ASIC, a programmable logic array, a non-programmable logic array, a random access memory, a read only memory, and the like.

The integrated circuit may include a logic circuit comprising a plurality of logic gates positioned to communicably engage the die terminals. One skilled in the art understands that logic gates include, but are not limited to, one or more AND gates, OR gates, NAND gates, NOR gates, XOR gates, shift registers, storage memory, and the like. In some embodiments, the logic gates are arranged to define a microprocessor including digital processing circuitry and memory. In certain exemplary embodiments, the logic circuit resides within an application specific integrated circuit (ASIC), a programmable logic array (PLA), or a read only memory.

This disclosure also provides an integrated circuit including a logic circuit having a plurality of logic gates positioned to communicably engage die terminals of an integrated circuit die. The die has a plurality of electrically conductive die terminals and is positioned on the central ground paddle of a lead frame. The lead frame includes I/O pads positioned proximate to the perimeter of the lead frame around the central ground paddle. Electrically conductive I/O circuit pads are also arranged about the die between the die and the I/O pads, each I/O circuit pad electrically connected to one of the I/O pads. Electrically conductive ground circuit pads, electrically connected to the central ground paddle, are also positioned around the die between the die and the I/O circuit pads. Electrically conductive bond wires connect one or more of the die terminals to one or more I/O circuit pads or one or more ground circuit pads. In some embodiments, one or more bond wires may also connect between an I/O circuit pad and a ground circuit pad.

The disclosure further provides a method for packaging an integrated circuit, including mounting an integrated circuit die including multiple electrically conductive die terminals to a central ground paddle on a lead frame, the lead frame having multiple peripheral ground circuit pads positioned around and electrically connected with the central ground paddle; forming multiple electrically conductive I/O circuit pads, each circuit pad positioned on and electrically connected with at least one of the I/O pads; forming multiple electrically conductive ground circuit pads on the central ground paddle around the die between the die and the I/O circuit pads, each ground circuit pad electrically connected with the central ground paddle; and electrically connecting multiple electrically conductive bond wires to the ground circuit paddles, each bond wire connecting between a die terminal and at least one of an I/O circuit pad or a ground circuit pad.

Each of the ground circuit pads has a shape defining a perimeter and an area. The shape of the ground circuit pads may include triangular, rectangular, trapezoidal, polygonal, hemispherical, and circular. The area defined by each of the ground circuit pad shapes is generally from about 0.01 mm$^2$ to about 0.5 mm$^2$. In some embodiments, ground circuit pads may have a generally quadrilaterial (e.g. square, rectangular, trapezoidal, or the like) shape. Rectangular shaped ground circuit pads preferably define an area from about 0.03 mm$^2$ to about 0.2 mm$^2$; trapezoidal shaped ground circuit pads preferably define an area from about 0.04 to about 0.2 mm$^2$, more preferably from about 0.05 to about 0.07 mm$^2$.

Formation of the multiple electrically conductive ground circuit pads and I/O circuit pads on the surface of the ground circuit paddles on the lead frame may be accomplished using methods familiar to those skilled in the art, for example, by electroplating a conductive metal to the surface of the lead frame in a defined pattern. The ground circuit pads and I/O circuit pads typically may include one or metal selected from of silver, gold, platinum, palladium, copper, aluminum, tin and nickel. The ground circuit paddles may be fabricated using many common conductive metals or metal alloys, but preferably include tin or other inexpensive, corrosion resistant metals. Lead frames may be fabricated using many common conductive metals or metal alloys, and may include insulative material, including for example, plastic, phenolic resins, dielectric films or sheets, and the like.

The integrated circuit die may be bonded to the central die paddle using a bonding material. Preferably, a conductive adhesive bonding materials is used to bond the die to the central die paddle. A mold compound may be used to overlay the lead frame and encapsulate an integrated circuit inserted in the die, as well as the bond wires, the ground circuit pads and optionally, a at least part of each circuit pad. Preferably, an insulative curable molding compound, for example, a curable epoxy resin, may be used as a mold compound.

Although the disclosure is directed at reducing packaging parasitics in integrated circuit packaging and assembly using circuit design and electroplating techniques, various additional features may be achieved. In some embodiments, for example, the invention may provide a generic packaging format capable of handling multiple die sizes and shapes without requiring alteration of the basic packaging assembly. In other embodiments, the invention may provide a reduced moisture sensitivity level for the integrated circuit by reducing the total surface area of plated metal used to provide multiple segmented ground circuit pads relative to a single, large area common electrical ground circuit paddle. In still other embodiments, the invention may reduce the tendency of the electroplated ground circuit pads to delaminate from the central ground paddle on the lead frame relative to a single, large area common electrical ground plane of the prior art. The invention may also reduce cost and improve reliability of integrated circuit packaging.

While this invention has been described in connection with what is presently considered to be the most practical embodiments, it is to be understood that the invention is not limited to the disclosed embodiments. In this regard, one of ordinary skill in the art might readily recognize that an integrated circuit according to the present invention may include various configurations in which a plurality of integrated circuit dies are disposed on a lead frame and/or house inside an integrated circuit package. Various embodiments of the invention have been described. These and other embodiments are within the scope of the following claimed.

The invention claimed is:

1. An integrated circuit package comprising:
   a lead frame comprising a plurality of input/output (I/O) pads positioned around a central ground paddle and proximate to a perimeter of the lead frame;
   an integrated circuit die positioned on the central ground paddle, wherein the integrated circuit die comprises a plurality of electrically conductive die terminals;
   a plurality of electrically conductive I/O circuit pads, each circuit pad positioned on and electrically connected with one of the I/O pads;
   a plurality of electrically conductive ground circuit pads positioned on the central ground paddle around the die between the die and the I/O circuit pads, wherein each ground circuit pad is electrically connected to the central ground paddle; and
   a plurality of electrically conductive bond wires, each bond wire electrically connecting a die terminal to at least one of an I/O circuit pad or a ground circuit pad, and wherein at least two of the bond wires are electrically connected to a single ground circuit pad.

2. The integrated circuit package of claim 1, further comprising an integrated circuit positioned to engage the die in electrical connection with the plurality of die terminals.

3. The integrated circuit package of claim 2, wherein the integrated circuit is selected from the group consisting of a microprocessor, an application specific integrated circuit (ASIC), a programmable logic array, a non-programmable logic array, a random access memory, and a read only memory.

4. The integrated circuit package of claim 1, wherein the die has a generally rectangular perimeter, and wherein the die terminals are positioned about the die perimeter.

5. The integrated circuit package of claim 1, wherein the lead frame has a plurality of edges defining a generally rectangular outer perimeter, and wherein the I/O circuit pads are positioned to extend beyond the outer perimeter proximate to the edges.

6. The integrated circuit package of claim 5, wherein the ground circuit pads form a generally linear array pattern about the die between the die and the edges.

7. The integrated circuit package of claim 6, wherein each of the ground circuit pads has a generally rectangular shape including a long dimension and a short dimension, and wherein each of the long dimensions is oriented substantially orthogonal to at least one of the edges.

8. The integrated circuit package of claim 6, wherein each of the ground circuit pads has a generally trapezoidal shape including a long dimension and a short dimension, and wherein the long dimension of one or more of the ground circuit pads is oriented at an angle of ninety degrees or less relative to at least one of the edges.

9. The integrated circuit package of claim 8, wherein the ground circuit pads form a generally fan-like pattern about the die.

10. The integrated circuit package of claim 1, wherein the central ground paddle has a plurality of edges defining a generally rectangular perimeter, each of the edges joining at least one other edge to form a corner, and wherein each corner is proximate to a generally trapezoidal shaped ground circuit pad oriented at an angle of ninety degrees or less relative to at least one of the joined edges.

11. The integrated circuit package of claim 1, further comprising at least one bond wire electrically connecting a ground circuit pad to an I/O circuit pad.

12. The integrated circuit package of claim 1, wherein the ground circuit pads include vertical, horizontal, angled, and corner ground circuit pads.

13. The integrated circuit package of claim 1, wherein the ground circuit pads and the I/O circuit pads have shapes selected from the group consisting of triangular, rectangular, trapezoidal, polygonal, hemispherical and circular.

14. The integrated circuit package of claim 1, wherein the ground circuit pads and the I/O circuit pads comprise one or more metal selected from the group consisting of silver, gold, platinum, palladium, copper, aluminum, tin and nickel.

15. The integrated circuit package of claim 1, further comprising a bonding material attaching the die to the central ground paddle.

16. An integrated circuit comprising:
  a lead frame comprising a plurality of input/output (I/O) pads positioned around a central ground paddle and proximate to a perimeter of the lead frame;
  an integrated circuit die positioned on the central ground paddle, wherein the die comprises a plurality of electrically conductive die terminals;
  a logic circuit comprising a plurality of logic gates positioned to communicably engage the die terminals;
  a plurality of electrically conductive I/O circuit pads, each circuit pad positioned on and electrically connected with one of the I/O pads;
  a plurality of electrically conductive ground circuit pads positioned on the central ground paddle around the die between the die and the I/O circuit pads, wherein each ground circuit pad is electrically connected to the central ground paddle and the ground circuit pads form a generally fan-like pattern about the die; and
  a plurality of electrically conductive bond wires, each bond wire electrically connecting a die terminal to at least one of an I/O circuit pad or a ground circuit pad.

17. The integrated circuit of claim 16, wherein the logic gates are arranged to define digital processing circuitry and memory.

18. The integrated circuit of claim 16, wherein the logic gates reside in an application specific integrated circuit (ASIC).

19. The integrated circuit of claim 16, wherein the die has a generally rectangular perimeter, and wherein the die terminals are positioned about the die perimeter.

20. The integrated circuit of claim 16, wherein the lead frame has a plurality of edges defining a generally rectangular outer perimeter, and wherein the I/O circuit pads are positioned within the outer perimeter proximate to the edges.

21. The integrated circuit of claim 20, wherein each of the ground circuit pads has a generally rectangular shape including a long dimension and a short dimension, and wherein each of the long dimensions is oriented substantially orthogonal to at least one of the edges.

22. The integrated circuit of claim 20, wherein each of the ground circuit pads has a generally trapezoidal shape including a long dimension and a short dimension, and wherein the long dimension of one or more of the ground circuit pads is oriented at an angle of ninety degrees or less relative to at least one of the edges.

23. The integrated circuit of claim 16, wherein the central ground paddle has a plurality of edges defining a generally rectangular perimeter, each of the edges joining at least one other edge to form a corner, and wherein each corner is proximate to a generally trapezoidal shaped ground circuit pad oriented at an angle of ninety degrees or less relative to one of the joined edges.

24. The integrated circuit of claim 16, further comprising at least one bond wire electrically connecting a ground circuit pad to an I/O circuit pad.

25. The integrated circuit of claim 16, wherein at least two bond wires electrically connect to a single ground circuit pad.

26. The integrated circuit of claim 16, wherein the ground circuit pads and the I/O circuit pads have shapes selected from the group consisting of triangular, rectangular, trapezoidal, polygonal, hemispherical and circular.

27. The integrated circuit of claim 16, wherein the ground circuit pads and the I/O circuit pads comprise one or more metal selected from the group consisting of silver, gold, platinum, palladium, copper, aluminum, tin and nickel.

28. The integrated circuit of claim 16, further comprising a mold compound overlaying the lead frame and insulating the integrated circuit, the die, the bond wires, the ground circuit pads and the I/O circuit pads.

29. An integrated circuit comprising:
  a lead frame comprising a plurality of input/output (I/O) pads positioned around a central ground paddle and proximate to a perimeter of the lead frame;
  an integrated circuit die positioned on the central ground paddle, wherein the die comprises a plurality of electrically conductive die terminals;
  a logic circuit comprising a plurality of logic gates positioned to communicably engage the die terminals;
  a plurality of electrically conductive I/O circuit pads, each circuit pad positioned on and electrically connected with one of the I/O pads;
  a plurality of electrically conductive ground circuit pads positioned on the central ground paddle around the die between the die and the I/O circuit pads, wherein each ground circuit pad is electrically connected to the central ground paddle, and wherein each ground circuit pad includes one of a vertical ground circuit pad, a horizontal ground circuit pad, an angled ground circuit pad, and a corner ground circuit pad; and
  a plurality of electrically conductive bond wires, each bond wire electrically connecting a die terminal to at least one of an I/O circuit pad or a ground circuit pad.

* * * * *

UNITED STATES PATENT AND TRADEMARK OFFICE
CERTIFICATE OF CORRECTION

PATENT NO. : 7,602,050 B2 Page 1 of 1
APPLICATION NO. : 11/399017
DATED : October 13, 2009
INVENTOR(S) : Sharma et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 630 days.

Signed and Sealed this

Fifth Day of October, 2010

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,602,050 B2 |
| APPLICATION NO. | : 11/399017 |
| DATED | : October 13, 2009 |
| INVENTOR(S) | : Sharma et al. |

It is certified that error appears in the above-identified patent and that said Letters Patent is hereby corrected as shown below:

Column 11, line 25, claim 14: "one or more metal" to read as --one or more metals--

Column 12, line 32, claim 27: "one or more metal" to read as --one or more metals--

Signed and Sealed this
Third Day of May, 2011

David J. Kappos
*Director of the United States Patent and Trademark Office*